(12) United States Patent
Kim et al.

(10) Patent No.: US 10,666,419 B2
(45) Date of Patent: May 26, 2020

(54) SEMICONDUCTOR CIRCUIT AND SEMICONDUCTOR SYSTEM

(71) Applicant: Samsung Electronics Co., Ltd., Suwon-si, Gyeonggi-do (KR)

(72) Inventors: Sung-Ha Kim, Yongin-si (KR); Hwa Seok Oh, Yongin-si (KR); Jin Hyeok Choi, Yongin-si (KR); Jang-Hoon Chun, Seoul (KR)

(73) Assignees: Samsung Electronics Co., Ltd., Gyeonggi-do (KR); Research & Business Foundation Sungkyunkwan University, Gyeonggi-do (KR)

( * ) Notice: Subject to any disclaimer, the term of this patent is extended or adjusted under 35 U.S.C. 154(b) by 0 days.

(21) Appl. No.: 16/108,310

(22) Filed: Aug. 22, 2018

(65) Prior Publication Data

US 2019/0280848 A1 Sep. 12, 2019

(30) Foreign Application Priority Data

Mar. 7, 2018 (KR) .................. 10-2018-0026917

(51) Int. Cl.
*H04L 7/00* (2006.01)
*H03K 5/24* (2006.01)
*H03G 1/00* (2006.01)
*H03F 3/45* (2006.01)

(52) U.S. Cl.
CPC ....... *H04L 7/0079* (2013.01); *H03F 3/45475* (2013.01); *H03G 1/0094* (2013.01); *H03K 5/24* (2013.01)

(58) Field of Classification Search
CPC ..... H04L 7/0079; H03F 3/45475; H03K 5/24; H03G 1/0094
USPC .............................................. 327/63, 64, 65
See application file for complete search history.

(56) References Cited

U.S. PATENT DOCUMENTS

| | | | |
|---|---|---|---|
| 5,028,815 A * | 7/1991 | Van De Plassche | ... H03K 5/249 327/65 |
| 7,095,667 B2 * | 8/2006 | Baker | ............ G11C 11/1673 365/207 |
| 8,188,764 B2 | 5/2012 | Weiss et al. | |
| 8,621,128 B2 | 12/2013 | Radulescu et al. | |
| 8,843,093 B2 | 9/2014 | De Vita et al. | |
| 9,069,551 B2 | 6/2015 | Iarovici et al. | |
| 9,077,320 B2 | 7/2015 | Shu | |
| 9,363,070 B2 | 6/2016 | Song et al. | |
| 9,684,361 B2 | 6/2017 | Park et al. | |
| 2010/0102632 A1 * | 4/2010 | Jochmann | ............... G05F 1/56 307/52 |
| 2015/0087255 A1 * | 3/2015 | Wentzloff | ........... H04B 1/1027 455/296 |
| 2015/0333746 A1 * | 11/2015 | Danjo | .................. H03K 5/249 327/63 |

* cited by examiner

*Primary Examiner* — John W Poos
(74) *Attorney, Agent, or Firm* — Harness, Dickey & Pierce, P.L.C.

(57) ABSTRACT

A semiconductor circuit including a clocked comparator and an offset application circuit. The clocked comparator is configured to receive a first input signal and a second input signal from a host and compare the first input signal and the second input signal. The offset application circuit is configured to apply an offset to the first input signal. The clocked comparator is configured to be driven based on a reference clock provided from the host.

20 Claims, 8 Drawing Sheets

SEMICONDUCTOR CIRCUIT AND SEMICONDUCTOR SYSTEM

This application claims the benefit of Korean Patent Application No. 10-2018-0026917, filed on Mar. 7, 2018, in the Korean Intellectual Property Office, the disclosure of which is incorporated herein in its entirety by reference.

BACKGROUND

1. Field

The present disclosure relates to semiconductor circuits and semiconductor systems.

2. Description of the Related Art

A computing system may include a host and a device which can exchange data with each other through various interfaces. Here, examples of the various interfaces include Universal Flash Storage (UFS), Small Computer System Interface (SCSI), Serial Attached SCSI (SAS), Serial Advanced Technology Attachment (SATA), Peripheral Component Interconnect Express (PCIe), embedded MultiMediaCard (eMMC), Fiber Channel (FC), Advanced Technology Attachment (ATA), Integrated Drive Electronics (IDE), Universal Serial Bus (USB), and IEEE 1394 (FireWire).

For example, in a computing system using a UFS interface, a physical layer that provides communication between a host and a device employs a Mobile Industry Processor Interface (MIPI). When a hibernation mode is enabled during a power saving mode of the device supported by the MIPI, the device is set to consume minimal power.

To exit the hibernation mode, the device includes a squelch circuit which detects a wake-up related signal provided from the host and wakes up the device at an appropriate time. However, the squelch circuit is enabled in the hibernation mode to monitor the wake-up related signal. Therefore, the power consumed by the squelch circuit in the hibernation mode also needs to be reduced.

SUMMARY

Example embodiments of the present disclosure provide a semiconductor circuit operating as a squelch circuit of a device with reduced power consumption.

Example embodiments of the present disclosure also provide a semiconductor system including a squelch circuit of a device with reduced power consumption.

However, example embodiments of the present disclosure are not restricted to the one set forth herein. The above and other example embodiments of the present disclosure will become more apparent to one of ordinary skill in the art to which the present disclosure pertains by referencing the detailed description of the present disclosure given below.

According to some example embodiments of the present disclosure, there is provided a semiconductor circuit including a clocked comparator and an offset application circuit. The clocked comparator is configured to receive a first input signal and a second input signal from a host and compare the first input signal and the second input signal. The offset application circuit is configured to apply an offset to the first input signal. The clocked comparator is configured to be driven based on a reference clock provided from the host.

According to other example embodiments of the present disclosure, there is provided a semiconductor circuit including a clocked comparator an offset application circuit, and a drive circuit. The clocked comparator is configured to compare a first input signal and a second input signal received from a host through a Universal Flash Storage InterConnect layer (UIC). The offset application circuit is configured to apply an offset to the first input signal. The device controller is electrically connected to the UIC. The clocked comparator is configured to be driven by a reference clock provided from the host when the device controller is not in a hibernation mode, and not be driven by the reference clock after the device controller enters the hibernation mode, and the clock comparator is configured to resume being driven by the reference clock before the device controller exits the hibernation mode.

According to other example embodiments of the present disclosure, there is provided a semiconductor system including an application processor (AP), a storage connected to the AP through a UFS, a display connected to the AP through a Display Serial Interface (DSI), and a PMU configured to supply power to the AP. The storage includes a first squelch circuit configured to be driven by a first reference clock, generate a first hibernation exit signal by comparing a first input signal and a second input signal received from the AP and provide the first hibernation exit signal to the PMU. The display includes a second squelch circuit configured to be driven by a second reference clock, generate a second hibernation exit signal by comparing a third input signal and a fourth input signal received from the AP, and provide the second hibernation exit signal to the PMU.

BRIEF DESCRIPTION OF THE DRAWINGS

These and/or other example embodiments will become apparent and more readily appreciated from the following description of the embodiments, taken in conjunction with the accompanying drawings in which.

DETAILED DESCRIPTION

Figure 1:
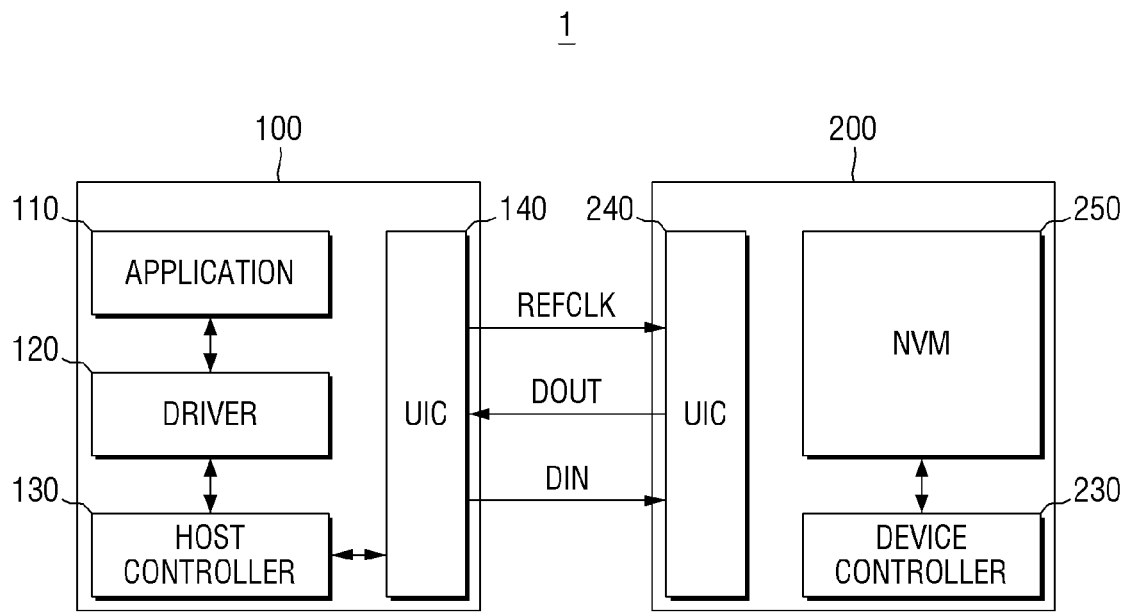
FIG. 1 is a schematic diagram of a semiconductor system according to some example embodiments.

FIG. 1 is a schematic diagram of a semiconductor system 1 according to some example embodiments.

Referring to FIG. 1, the semiconductor system 1 according to the example embodiments includes a host 100 and a device 200.

In some example embodiments, the host 100 and the device 200 may be connected through an electrical interface such as Universal Flash Storage (UFS), Small Computer System Interface (SCSI), Serial Attached SCSI (SAS), Serial Advanced Technology Attachment (SATA), Peripheral Component Interconnect Express (PCIe), embedded Multi-MediaCard (eMMC), Fiber Channel (FC), Advanced Technology Attachment (ATA), Integrated Drive Electronics (IDE), Universal Serial Bus (USB), or IEEE 1394 (FireWire). Alternatively, any interface that allows data to be exchanged between the host 100 and the device 200 can be employed.

For clarity and ease of description of the core of the present disclosure, it will be assumed that the host 100 and the device 200 are connected through a UFS electrical interface and that the host 100 is a UFS host and the device 200 is a UFS memory device. However, the scope of the present disclosure is not limited to this assumption, and the present disclosure is applicable to any storage system using any interface such as the above electrical interfaces.

The host 100 includes an application 110, a driver 120, a host controller 130, and a Universal Flash Storage Inter-Connect layer (UIC) 140 operating as a host interface.

In some example embodiments, the host 100 may further include a buffer memory. The buffer memory may be used as a main memory of the host 100 or a cache memory or temporary memory for temporarily storing data. In some example embodiments, the buffer memory may include a volatile memory such as a dynamic random access memory (DRAM).

The application 110 may be executed on the host 100 to control the semiconductor system 1 based on a set of commands that can be used in the semiconductor system 1.

The driver 120 may drive the device 200 connected to the host 100. Specifically, the driver 120 may receive a command for controlling the device 200 from the application 110, process the command using the host controller 130, and then provide the processing result to the application 110.

The application 110 and the driver 120 may be, but are not necessarily, implemented in software executed by a processor included in the host 100.

The host controller 130 controls the overall operation of the host 100. For example, the host controller 130 may transmit data stored in the buffer memory to the device 200 through the UIC (i.e., the host interface) 140 in response to a write command received from the driver 120. In addition, the host controller 130 may receive data from the device 200 through the UIC 140 in response to a read command received from the driver 120.

The UIC (i.e., the host interface) 140 may exchange data with a UIC 240, which corresponds to a device interface of the device 200, through data lines DIN and DOUT. The UIC 140 may provide a reference clock REFCLK, which can be used for operation of at least a portion of the device 200, to the UIC 240 of the device 200.

In some example embodiments, the UIC 140 of the host 100 and the UIC 240 of the device 200 may handle the connection between the host 100 and the device 200 and employ, for example, Mobile Industry Processor Interface (MIPI) UniPro or MIPI M-PHY.

The device 200 includes a device controller 230, the UIC 240, and a non-volatile memory (NVM) 250.

The device controller 230 controls the overall operation of the device 230. For example, the device controller 230 may write, read, or erase data requested by the host 100 to or from the NVM 250. To this end, like the host 100, the device 200 may further include a buffer memory.

The NVM 250 may include, but not limited to, a flash memory, a magnetoresistive random access memory (MRAM), a phase-change random access memory (PRAM), a ferroelectric random access memory (FeRAM), etc.

Figure 2:
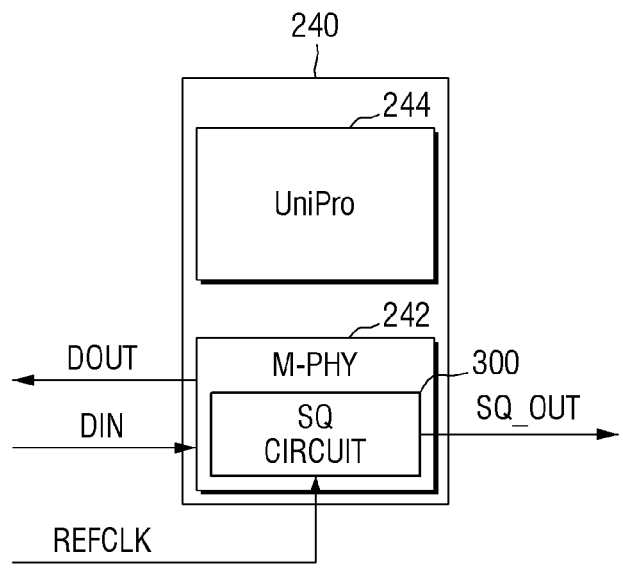
FIG. 2 is a schematic diagram of a semiconductor circuit according to some example embodiments.

FIG. 2 is a schematic diagram of a semiconductor circuit according to some example embodiments.

Referring to FIG. 2, the UIC 240 of the device 200 may include a physical layer and a transport layer for data transmission between the host 100 and the device 200. Specifically, the UIC 240 may include, e.g., M-PHY 242 as a physical layer and, e.g., UniPro 244 as a transport layer. Known technical details about MIPI M-PHY and MIPI UniPro can be found in a standard specification issued by MIPI.

The MIPI supports a power saving mode or a hibernation mode of the device 200. The power saving mode may include a very low power mode or an ultra-low power mode, a low power mode, a standby mode, etc., and the hibernation mode mentioned herein refers to the very low power mode or the ultra-low power mode such as HIBERN8 defined in the MIPI standard. That is, when the device 200 enters the hibernation mode, it is set to consume minimal power until woken up.

To exit the hibernation mode, the device 200 includes a squelch circuit 300 which detects a wake-up related signal provided from the host 100 and wakes up the device 200 at an appropriate time. However, the squelch circuit 300 is enabled in the hibernation mode to monitor the wake-up related signal.

A conventional squelch circuit is configured such that a comparator used to detect a wake-up related signal (e.g., a DIF_N signal) provided by a host consumes a large amount of static current. Even if the conventional squelch circuit is configured such that the comparator does not consume static current, the conventional squelch circuit consumes a large amount of dynamic current due to the addition of a clock generation circuit. The squelch circuit 300 according to various example embodiments is designed to eliminate or minimize the consumption of such static current or dynamic current.

The squelch circuit 300 according to the present disclosure receives a wake-up related signal (e.g., a DIF_N signal) through the data line DIN connected to the host 100. In addition, the squelch circuit 300 receives the reference clock REFCLK from the host 100.

In the current example embodiment, the squelch circuit 300 may receive the reference clock REFCLK directly from the host 100. Alternatively, the squelch circuit 300 may receive the reference clock REFCLK generated by the host 100 via another circuit or may receive the reference clock REFCLK generated by a circuit other than the host 100. Various modifications to the generation of the reference clock REFCLK are apparent to those skilled in the art.

After receiving the wake-up related signal and the reference clock REFCLK, the squelch circuit 300 generates an output signal SQ_OUT. The output signal SQ_OUT may include, for example, a hibernation exit signal HIB_EXIT for causing the device 200 to exit the hibernation mode.

This will be described in more detail later with reference to FIGS. 3 through 5.

Figure 3:
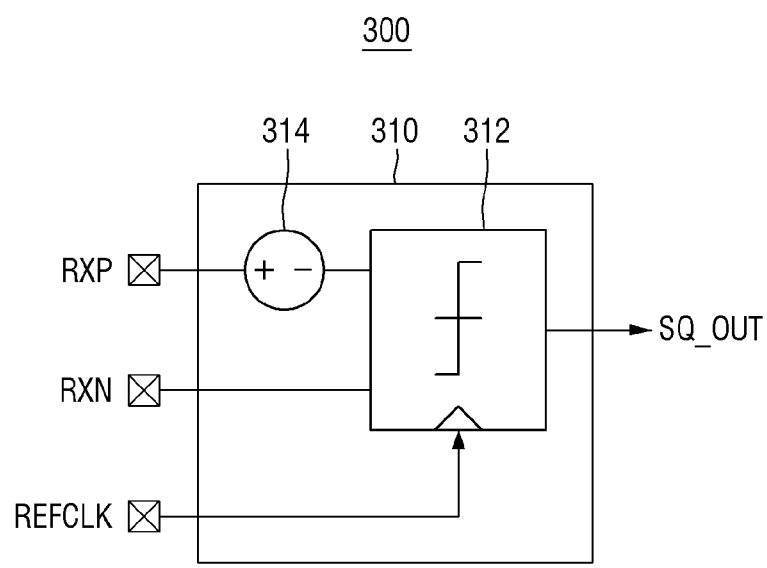
FIG. 3 is a schematic diagram of a semiconductor circuit according to some example embodiments.

FIG. 3 is a schematic diagram of a semiconductor circuit 300 according to some example embodiment.

Referring to FIG. 3, the semiconductor circuit 300 according to some example embodiments includes a squelch circuit 310 including a clocked comparator 312 and an offset application circuit 314.

The clocked comparator 312 is a comparator configured to compares level of two input signals and is configured to be driven by a clock. In the current example embodiment, the clocked comparator 312 is configured to receive a first input signal RXP and a second input signal RXN from the host 100 and compare the first input signal RXP and the second input signal RXN. In particular, the clocked comparator 312 may receive the first input signal RXP and the second input signal RXN from the host 100 through MIPI M-PHY of a UFS interface.

For example, when receiving, as wake-up related signals, the first input signal RXP having a first logic value L and the second input signal RXP transiting from the first logic value L to a second logic value H from the host 100, the clocked comparator 312 may be configured to detect a difference between the first input signal RXP and the second input signal RXN at the transition time and output the output signal SQ_OUT including, e.g., the hibernation exit signal HIB_EXIT according to a prescribed rule.

That is, the clocked comparator 312 may be configured to output the hibernation exit signal HIB_EXIT based on the result of comparing the first input signal RXP and the second input signal RXN and provide the hibernation exit signal HIB_EXIT to another circuit in the device 200 or to a power management unit (PMU).

The offset application circuit 314 may apply an offset to the first input signal RXP. That is, when determining necessary for circuit implementation, the offset application circuit 314 may be configured to apply an offset (e.g., a voltage offset of 100 mV) to the first input signal RXP, so that the clocked comparator 312 compares the first input signal RXP to which the offset has been applied, with the second input signal RXN.

Since an offset can be applied to an input signal as described above, the semiconductor circuit 300 of the present disclosure can set, as needed, a threshold level based on which whether the hibernation mode has ended is determined by comparing the first input signal RXP and the second input signal RXN. This makes more precise control possible.

Although the offset application circuit 314 is represented by a voltage source in FIG. 3 for convenience, this is merely a conceptual and abstract representation of applying a voltage offset, and the offset application circuit 314 can be implemented in various forms. One implementation example of the offset application circuit 314 will be described later with reference to FIG. 5.

In various example embodiments, the clocked comparator 312 is configured to be driven by the reference clock REFCLK provided from the host 100.

The host 100 stops providing the reference clock REFCLK to the device 200 when the device 200 enters the hibernation mode and resumes providing the reference clock REFCLK shortly before the device 200 exits the hibernation mode.

Accordingly, the clocked comparator 312 is configured to power off when the provision of the reference clock REFCLK from the host 100 is stopped and power on when the provision of the reference clock REFCLK from the host 100 is resumed.

Consequently, since the clocked comparator 312 is designed to be driven by the reference clock REFCLK provided from the host 100, the clocked comparator 312 of the semiconductor circuit 300 consumes only a very small current, which can be generated by leakage, during the interruption of the provision of the reference clock REFCLK. Furthermore, the clocked comparator 312 consumes only a small current of, e.g., about 0.25 uA per 1 MHz even in a certain period during which the reference clock REFCLK is provided in the hibernation mode. Therefore, power can be saved significantly, and the life of a battery, if used by the device 200, can also be increased.

Figure 4:
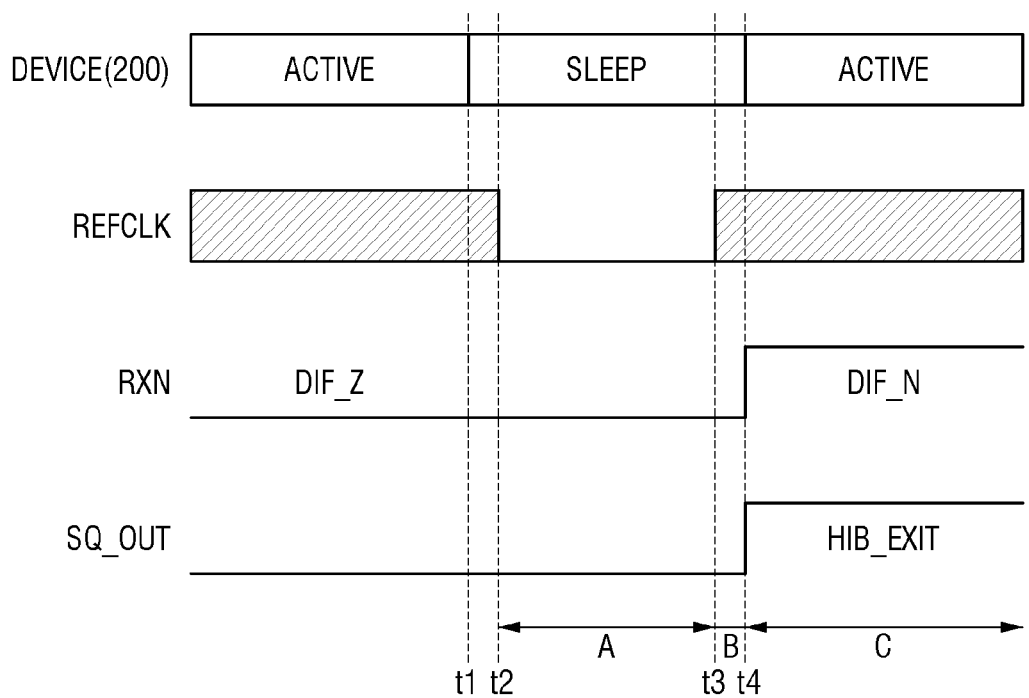
FIG. 4 is a diagram for explaining the operation of the semiconductor circuit according to the example embodiments of FIG. 3.

FIG. 4 is a diagram for explaining the operation of the semiconductor circuit 300 according to some example embodiments of FIG. 3.

Referring to FIG. 4, in a period up to a time t1 during which the device 200 is in an active state, the host 100 provides the reference clock REFCLK, and the second input signal RXN of the device 200 may include a signal which is not related to wake-up (such as a DIF_Z signal) having, e.g., the first logic value L. Accordingly, the semiconductor circuit 300 according to some example embodiments may output, e.g., a signal having the first logic value L as a result of comparing the first input signal RXP with the second input signal RXN.

Then, when the device 200 switches to a sleep state (that is, enters the hibernation mode) at the time t1, the host 100 stops providing the reference clock REFCLK to the device 200 at a time t2 after a predetermined period of time from the time t1. Accordingly, the operation of the clocked comparator 312 is also stopped.

In a period A from the time t2 to a time t3, the device 200 is in the hibernation mode, and the host 100 does not provide the reference clock REFCLK. Therefore, the clocked comparator 312, which uses the reference clock REFCLK as a driving clock, is powered off. Accordingly, the semiconductor circuit 300 consumes only a very small current that may be generated by leakage.

At the time t3, the host 100 resumes providing the reference clock REFCLK, and the clocked comparator 312, which uses the reference clock REFCLK as the driving clock, is powered on.

At a time t4, the host 100 provides a wake-up related signal (such as a DIF_N signal) having, e.g., the second logic value H to the device 200 as the second input signal RXN. That is, a period B is a period during which the reference clock REFCLK is provided in the hibernation mode. In the period B, the semiconductor circuit 300 consumes only a small current of, e.g., about 0.25 uA per 1 MHz.

At the time t4, the hibernation exit signal HIB_EXIT for informing other elements of the device 200 that the hibernation mode has ended is output as the output signal SQ_OUT as a result of comparison between the first input signal RXP and the second input signal RXN. The hibernation exit signal HIB_EXIT may be provided to other circuits in the device 200 or may be provided to the PMU.

Since the semiconductor circuit 300 operates as described above, the clocked comparator 312 of the semiconductor circuit 300 consumes only a very small current that can be generated by leakage while the host 100 stops providing the reference clock REFCLK. Furthermore, the clocked comparator 312 consumes only a small current of, e.g., about 0.25 uA per 1 MHz even in a certain period during which the reference clock REFCLK is provided in the hibernation mode. Therefore, power can be saved significantly, and the life of a battery, if used by the device 200, can also be increased.

Figure 5:
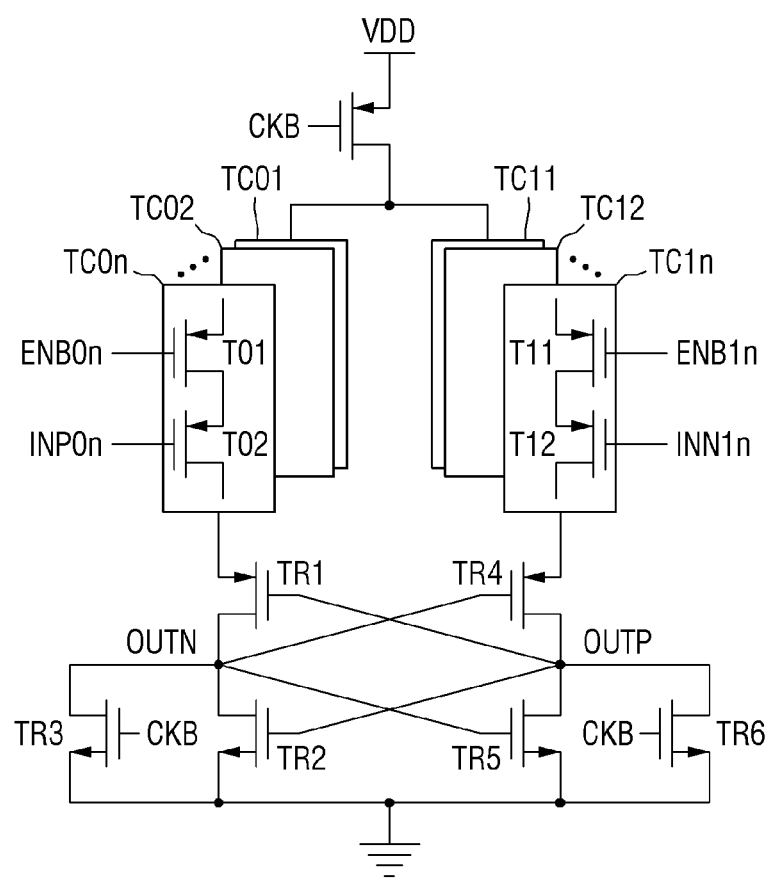
FIG. 5 is a circuit diagram of an implementation example of the semiconductor circuit according to the example embodiments of FIG. 3.

FIG. 5 is a circuit diagram of an implementation example of the semiconductor circuit 300 according to some example embodiments of FIG. 3.

Referring to FIG. 5, the clocked comparator 312 and the offset application circuit 314 according to some example embodiments may be implemented as, for example, a strong arm latch type as follows.

When a CKB signal transmitted to each of gates of transistors TR3 and TR6 is at a second logic level H, nodes OUTN and OUTP receive a ground voltage to become a first logic level L. Accordingly, transistors TR1, TR2, TR4 and TR5 are turned off, and an operation of pre-charging a circuit is performed by an uppermost transistor that provides a VDD voltage. When the CKB signal transmitted to each of the gates of the transistors TR3 and TR6 transits to the first logic level L, an operation of comparing input signals INP0$n$ and INN1$n$ is performed.

In particular, to implement the offset application circuit 314, a circuit corresponding to the implementation example of FIG. 5 includes a plurality of differential input transistor circuits TC01 through TC0$n$ and TC11 through TC1$n$.

Specifically, the differential input transistor circuits TC01 through TC0$n$ and TC11 through TC1$n$ include a plurality of first differential input transistor circuits TC01 through TC0$n$ and a plurality of second differential input transistor circuits TC11 through TC1$n$.

Each of the first differential input transistor circuits TC01 through TC0$n$ includes a first transistor T01 gated by a first enable signal ENB0$n$ and a second transistor T02 gated by a first input signal INP0$n$ and connected in series to the first transistor T02. Here, the first input signal INP0$n$ refers to the first input signal RXP received from the host 100.

The first differential input transistor circuits TC01 through TC0$n$ may turn on or turn off their respective first transistors T01 under the control of the respective first enable signals ENB0$n$, thereby driving some or all of the second transistors T02 gated by the first input signals INP0$n$, respectively.

Each of the second differential input transistor circuits TC11 through TC1$n$ includes a third transistor T11 gated by a second enable signal ENB1$n$ and a fourth transistor T12 gated by a second input signal INN1$n$ and connected in series to the third transistor TI 1. Here, the second input signal INN1$n$ refers to the second input signal RXN received from the host 100.

The second differential input transistor circuits TC11 through TC1$n$ may turn on or turn off their respective third transistors TI 1 under the control of the respective second enable signals ENB1$n$, thereby driving some or all of the fourth transistors T12 gated by the second input signals INN in, respectively.

By setting the number of the second transistors T02 to be driven among the second transistors T02 respectively gated by the first input signals INP0$n$ and the number of the fourth transistors T12 to be driven among the fourth transistors T12 respectively gated by the second input signals INN1$n$ to different numbers, the effect of applying an offset to the first input signal RXP or the second input signal RXN can be generated.

In other words, an offset may be set for the first input signal RXP or the second input signal RXN by controlling the first enable signal ENB0$n$ provided to each of the first differential input transistor circuits TC01 through TC0$n$. To this end, the device 200 may control the first enable signals ENB0N provided to a portion of the plurality of the first differential input transistor circuits TC01 through TC0$n$ to correspond to the first logic value L and control the first enable signals ENB0N provided to another portion of the plurality of the first differential input transistor circuits TC01 through TC0$n$ to correspond to the second logic value H different from the first logic value L.

Similarly, an offset may be set for the first input signal RXP or the second input signal RXN by controlling the second enable signal ENB1$n$ provided to each of the second differential input transistor circuits TC11 through TC1$n$. To this end, the device 200 may control the second enable signals ENB1N provided to a portion of the plurality of the second differential input transistor circuits TC11 through TC1$n$ to correspond to the first logic value L and control the second enable signals ENB1N provided to another portion of the plurality of the second differential input transistor circuits TC11 through TC1$n$ to correspond to the second logic value H different from the first logic value L.

While the offset application circuit 314 can be implemented in the above example manner, the implementation method of the present disclosure is not limited to the above method and may vary.

Since an offset can be applied to an input signal as described above, the semiconductor circuit 300 of the present disclosure can set, as needed, a threshold level based on which whether the hibernation mode has ended is determined by comparing the first input signal RXP and the second input signal RXN. This makes more precise control possible.

Figure 6:
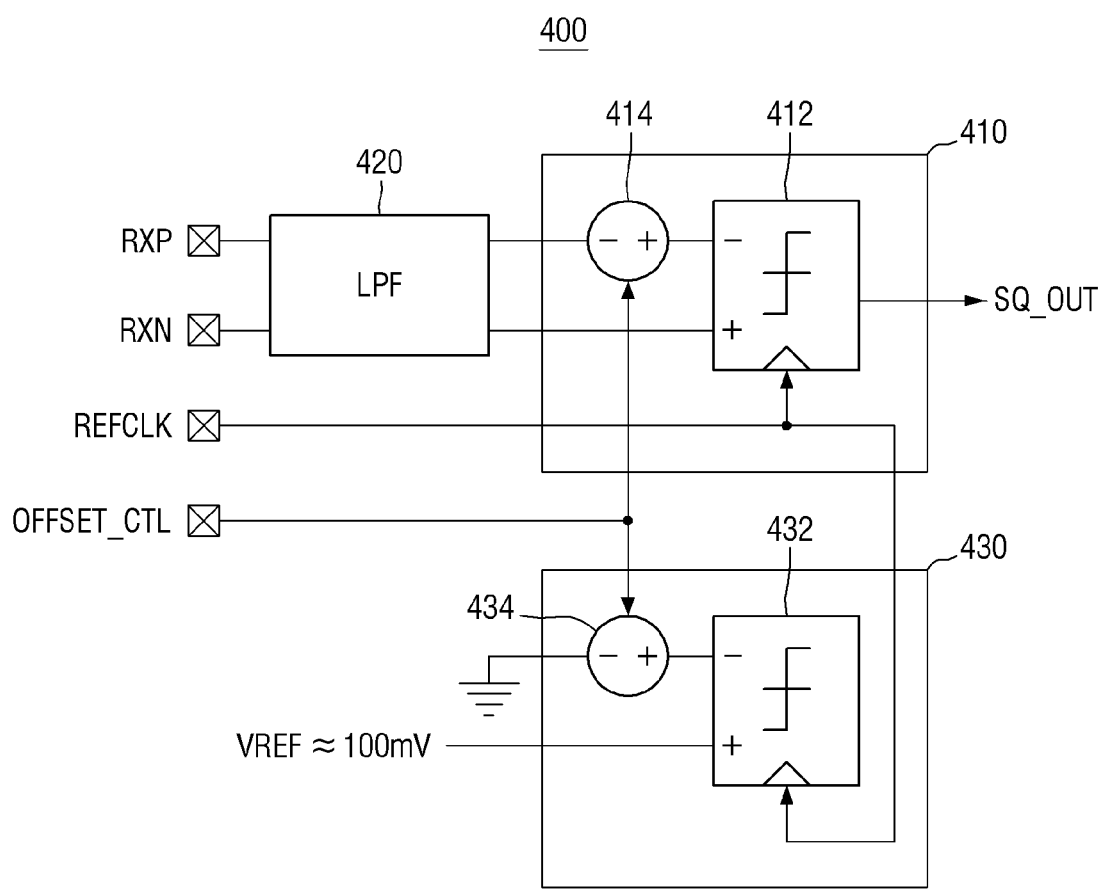
FIG. 6 is a schematic diagram of a semiconductor circuit according to some example embodiments.

FIG. 6 is a schematic diagram of a semiconductor circuit 400 according to some example embodiments.

Referring to FIG. 6, the semiconductor circuit 400 according to some example embodiments may further include a low pass filter 420.

The low pass filter 420 may be configured to receive the first input signal RXP and the second input signal RXN from the host 100, perform a low pass filter operation on the first input signal RXP and the second input signal RXN, and then provide the first input signal RXP and the second input signal RXN to a clocked comparator 412.

Since the low pass filter operation is performed on the first input signal RXP and the second input signal RXN received from the host 100, noise contained in the first input signal RXP and the second input signal RXN can be removed. In addition, since the low pass filter 420 does not generate any static current, the noise contained in the first input signal RXP and the second input signal RXN can be removed while low current consumption is maintained.

The semiconductor circuit 400 according to some example embodiments may include a replica squelch circuit 410 in addition to a squelch circuit 410 including the clocked comparator 412 and an offset application circuit 414. The clocked comparator 412 and the offset application circuit 414 correspond to the clocked comparator 312 and the offset application circuit 314 described above with reference to FIG. 3, etc.

The replica squelch circuit 430 includes a replica clocked comparator 432 and a replica offset application circuit 434.

The replica clocked comparator 432 is configured to be driven by the reference clock REFCLK provided from the host 100. The replica clocked comparator 432 is configured to receive an output signal of the replica offset application circuit 434 having an end to which a ground voltage is applied and a reference voltage signal VREF and compare the output signal with the reference voltage signal VREF.

The replica squelch circuit 430 may not operate while the device 200 is in the hibernation mode. Instead, while the device 200 is active, the replica squelch circuit 430 is configured to measure an appropriate operating environment to be set in the squelch circuit 410.

For example, while the device 200 is active, the replica squelch circuit 430 may be configured to determine an offset value to be set in the offset application circuit 414 as needed. The offset value determined by the replica squelch circuit 430 may be applied to the squelch circuit 410, so that the offset is set in the offset application circuit 414 while the device 200 is in the hibernation mode.

Since an offset determined by reflecting the actual environment of the device 200 can be applied to an input signal as described above, the semiconductor circuit 400 according to the present disclosure can set a threshold level based on which whether the hibernation mode has ended is determined by comparing the first input signal RXP with the second input signal RXN. This makes more precise control possible.

Figure 7:
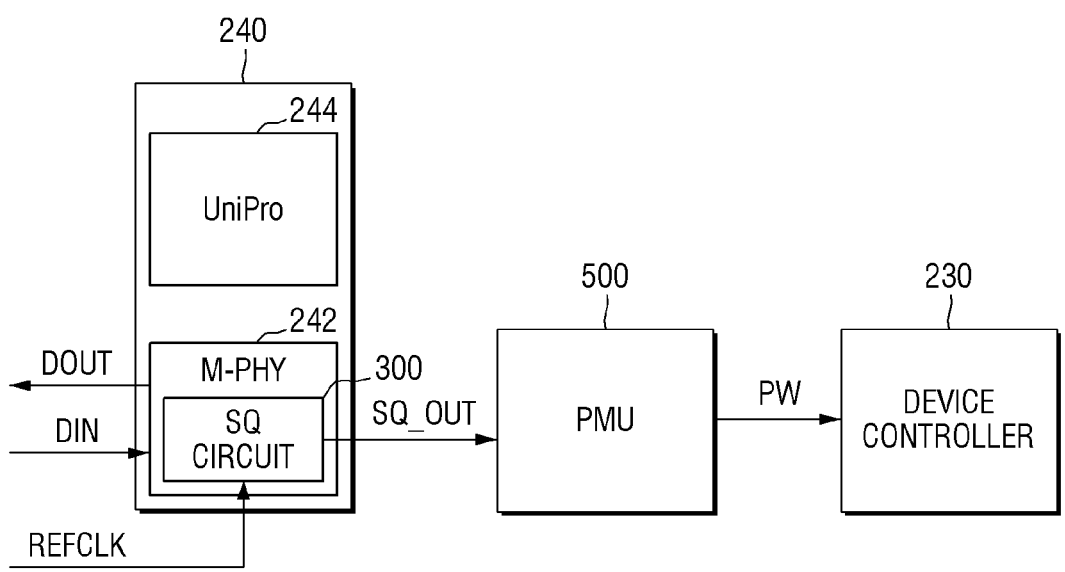
FIG. 7 is a schematic diagram of the semiconductor circuit according to some example embodiments.

FIG. 7 is a schematic diagram of the semiconductor circuit 300 according to some example embodiments.

Referring to FIG. 7, the clocked comparator 312 of the semiconductor circuit 300 described above may output the hibernation exit signal HIB_EXIT based on the result of comparing the first input signal RXP and the second input signal RXN and then provide the hibernation exit signal HIB_EXIT to a PMU 500.

The PMU 500 may be configured to provide power PW to, e.g., the device controller 230 of the device 200 in response to the hibernation exit signal HIB_EXIT. Similarly, the PMU 500 may be configured to provide the power PW to other elements of the device 200 such as the NVM 250 and the buffer memory in response to the hibernation exit signal HIB_EXIT.

Figure 8:
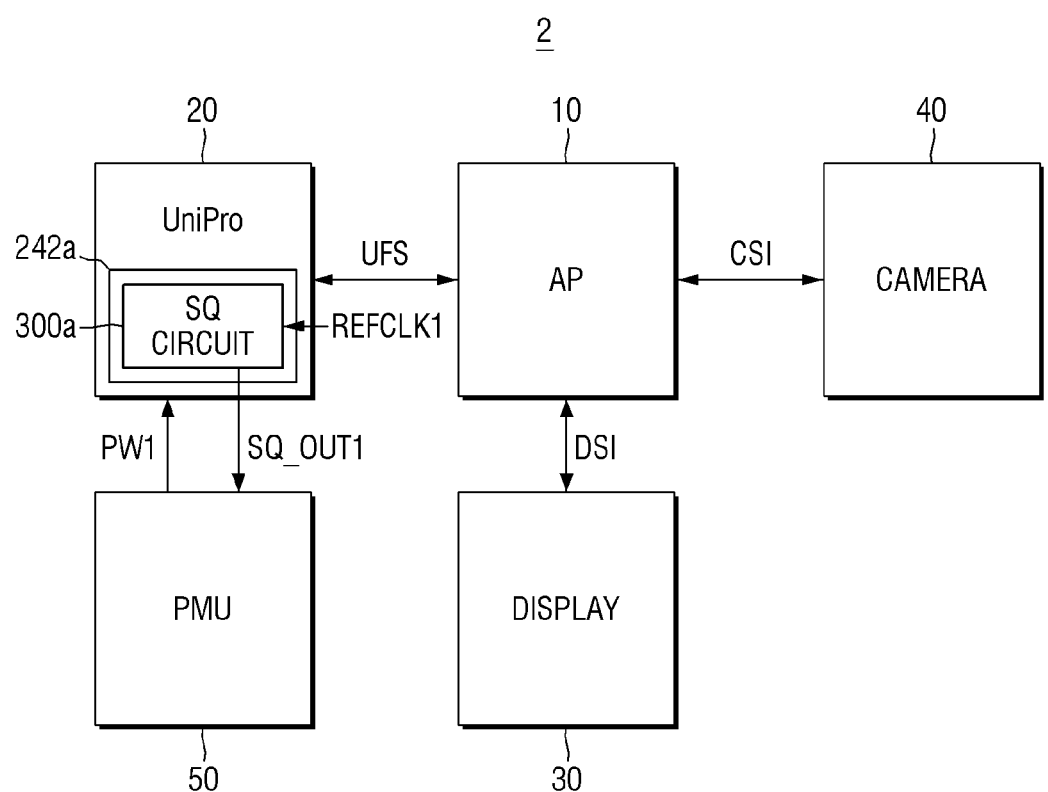
FIGS. 8 through 10 are schematic diagrams of a semiconductor system according to some example embodiments.
Figure 9:
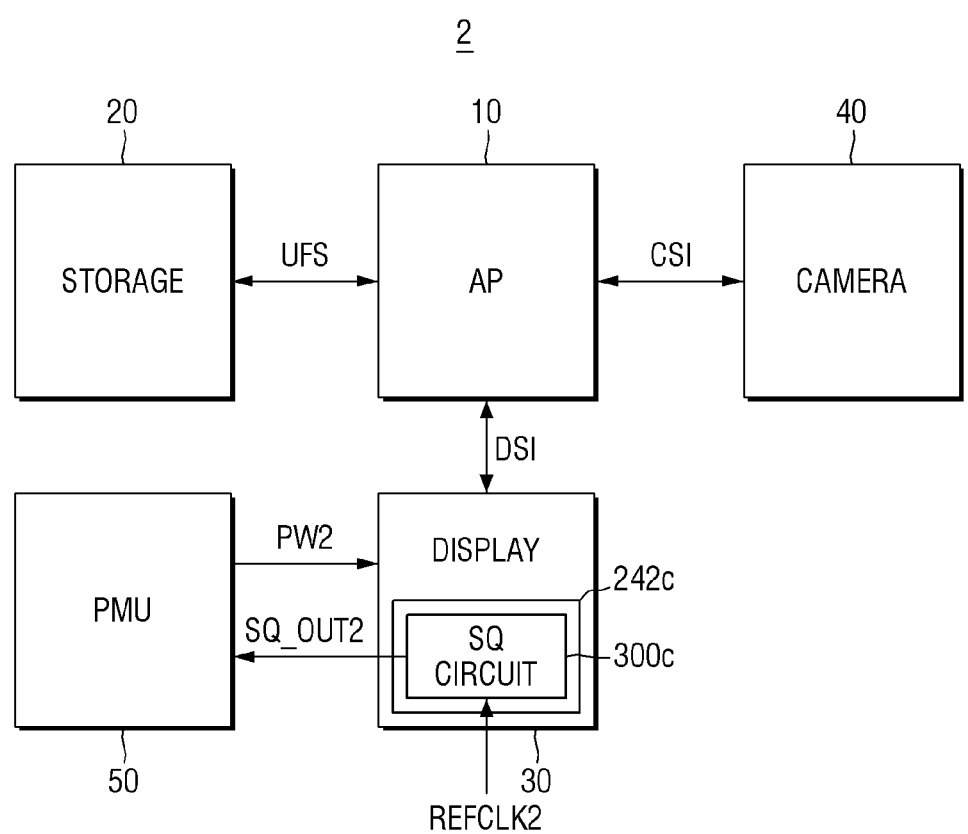
Figure 10:
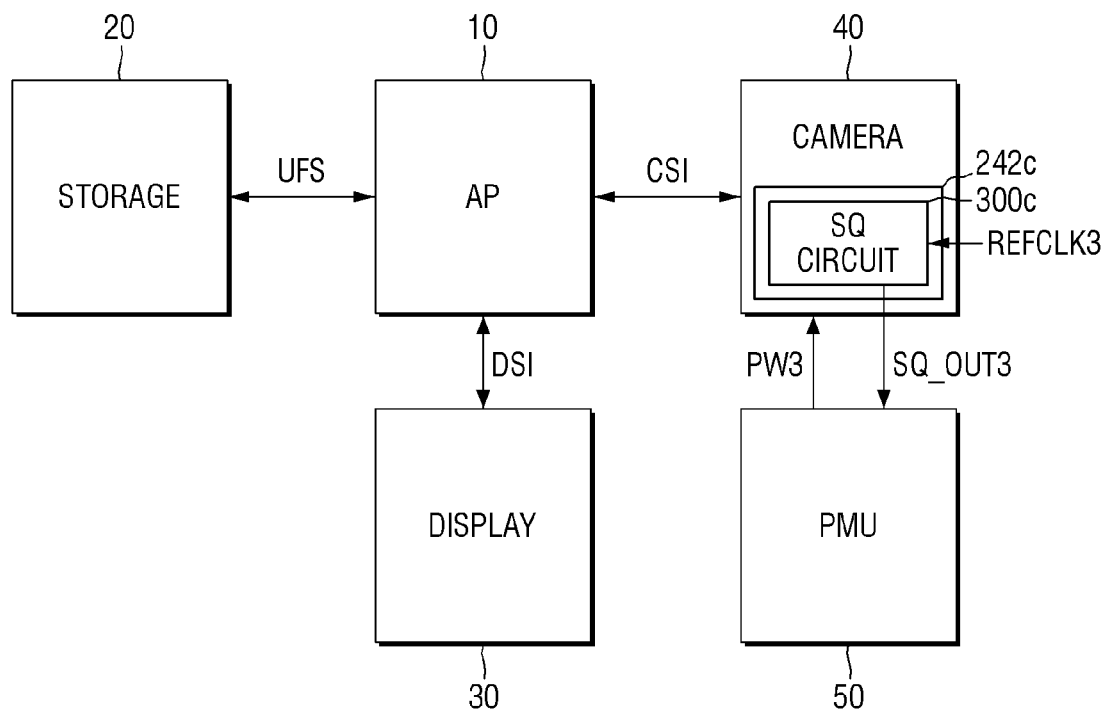

FIGS. 8 through 10 are schematic diagrams of a semiconductor system 2 according to some example embodiments.

Referring to FIG. 8, the semiconductor system 2 according to some example embodiments may include an application processor (AP) 10, a storage 20, a display 30, a camera 40, and a PMU 50.

In the current example embodiment, the AP 10 and the storage 20 may be connected through a UFS interface, and the AP 10 and the display 30 may be connected through a Display Serial Interface (DSI). In addition, the AP 10 and the camera 40 may be connected through a Camera Serial Interface (CSI).

In the current example embodiment, the storage 20 may include a first squelch circuit 300a configured to be is driven by a first reference clock REFCLK1, generate a first output signal SQ_OUT1 including a first hibernation exit signal HIB_EXIT1 by comparing a first input signal RXP and a second input signal RXN received from the AP 100 and provide the first output signal SQ_OUT1 to the PMU 50. The PMU 50 may be configured provide first power PW1 to the storage 20 in response to the first hibernation exit signal HIB_EXIT1.

In addition, referring to FIG. 9, the display 30 may include MIPI M-PHY as its physical layer. Further, the display 30 may include a second squelch circuit 300b implemented in the MIPI M-PHY.

The second squelch circuit 300b is configured to be driven by a second reference clock REFCLK2, generate a second output signal SQ_OUT2 including a second hibernation exit signal HIB_EXIT2 by comparing a third input signal RXP and a fourth input signal RXN received from the AP 100, and provide the second output signal SQ_OUT2 to the PMU 50. The PMU 50 may be configured to provide second power PW2 to the display 30 in response to the second hibernation exit signal HIB_EXIT2.

Since the second squelch circuit 300b is implemented using a clocked comparator driven by the second reference clock REFCLK2 as described above, it is possible to eliminate or minimize the consumption of static or dynamic current of the display 30 in the hibernation mode as in the case of the storage 20.

In addition, referring to FIG. 10, the camera 40 may include MIPI M-PHY as its physical layer. Further, the camera 40 may include a third squelch circuit 300c implemented in the MIPI M-PHY.

The third squelch circuit 300c is driven by a third reference clock REFCLK3, generates a third output signal SQ_OUT3 including a third hibernation exit signal HIB_EXIT3 by comparing a fifth input signal RXP and a sixth input signal RXN received from the AP 100, and provides the third output signal SQ_OUT3 to the PMU 50. The PMU 50 may be configured to provide third power PW3 to the camera 40 in response to the third hibernation exit signal HIB_EXIT3.

Since the third squelch circuit 300c is implemented using a clocked comparator driven by the third reference clock REFCLK3 as described above, it is possible to eliminate or minimize the consumption of static or dynamic current of the camera 40 in the hibernation mode as in the case of the storage 20.

In the current example embodiment, the squelch circuits 300a, 300b and 300c may receive the reference clocks REFCLK1, REFCLK2 and REFCLK3 directly from a host 100. Alternatively, the squelch circuits 300a, 300b and 300c may receive the reference clocks REFCLK1, REFCLK2 and REFCLK3 generated by the host 100 via another circuit or may receive the reference clocks REFCLK1, REFCLK2 and REFCLK3 generated by a circuit other than the host 100.

According to the various example embodiments described so far, a clocked comparator capable of setting an offset may be used and designed to be driven by a reference clock provided from a host. Therefore, a device according to various example embodiments consumes only a very small current that can be generated by leakage while the host stops providing the reference clock. Furthermore, the clocked comparator consumes only a small current of, e.g., about 0.25 uA per 1 MHz even in a certain period during which the reference clock is provided in a hibernation mode. Therefore, power can be saved significantly, and the life of a battery, if used by the device, can also be increased.

Moreover, since an offset can be applied to an input signal, it is possible to set, as needed, a threshold level based on which whether the hibernation mode has ended is determined by comparing a first input signal RXP and a second input signal RXN. Thus, a squelch circuit can be controlled more precisely.

In concluding the detailed description, those skilled in the art will appreciate that many variations and modifications can be made to the preferred example embodiments without substantially departing from the principles of the present disclosure. Therefore, the disclosed preferred example embodiments of the disclosure are used in a generic and descriptive sense only and not for purposes of limitation.

What is claimed is:

1. A semiconductor circuit comprising:
   a clocked comparator configured to,
      receive a first input signal and a second input signal from a host and
      compare the first input signal and the second input signal; and
   an offset application circuit configured to apply an offset to the first input signal,
   wherein the clocked comparator is configured to be driven based on a reference clock provided from the host, and
   wherein the second input signal is a wake-up signal.

2. The semiconductor circuit of claim 1, wherein the clocked comparator is configured to,
   power off when the provision of the reference clock from the host is stopped, and
   power on when the provision of the reference clock from the host is resumed.

3. The semiconductor circuit of claim 1, wherein the clocked comparator is configured to, output a hibernation exit signal based on a result of comparing the first input signal and the second input signal, and provide the hibernation exit signal to a power management unit (PMU).

4. The semiconductor circuit of claim 1, wherein the second input signal transits from a DIF_Z value to a DIF_N value.

5. The semiconductor circuit of claim 1, wherein the clocked comparator is configured to receive the first input signal and the second input signal from the host through a Mobile Industry Processor Interface (MIPI) M-PHY layer of a Universal Flash Storage (UFS) interface.

6. The semiconductor circuit of claim 1, wherein the offset application circuit includes a plurality of differential input transistor circuits.

7. The semiconductor circuit of claim 6, wherein the differential input transistor circuits includes, a plurality of first differential input transistor circuits, each including a first transistor gated by a first enable signal and a second transistor gated by the first input signal and connected in series to the first transistor, and a plurality of second differential input transistor circuits, each including a third transistor gated by a second enable signal and a fourth transistor gated by the second input signal and connected in series to the third transistor.

8. The semiconductor circuit of claim 7, wherein the first enable signal of each of the plurality of the first differential input transistor circuits included in a portion of the plurality of the first differential input transistor circuits corresponds to a first logic value, and the first enable signal of each of the plurality of first differential input transistor circuits included in another portion of the plurality of the first differential input transistor circuits corresponds to a second logic value different from the first logic value.

9. The semiconductor circuit of claim 7, wherein the second enable signal of each of the plurality of the second differential input transistor circuits included in a portion of the plurality of the second differential input transistor circuits corresponds to a first logic value, and the second enable signal of each of the plurality of the second differential input transistor circuits included in another portion of the plurality of the second differential input transistor circuits corresponds to a second logic value different from the first logic value.

10. The semiconductor circuit of claim 1, further comprising:

a low pass filter configured to, receive the first input signal and the second input signal from the host, perform a low pass filter operation on the first input signal and the second input signal, and then provide the first input signal and the second input signal to the clocked comparator.

11. The semiconductor circuit of claim 1, further comprising:

a replica clocked comparator configured to, be driven by the reference clock provided from the host and receives, and compare an output signal of a replica offset application circuit and a reference voltage signal.

12. A semiconductor circuit comprising:

a clocked comparator configured to compare a first input signal and a second input signal received from a host through a Universal Flash Storage InterConnect layer (UIC);

an offset application circuit configured to apply an offset to the first input signal; and a device controller electrically connected to the UIC, wherein the clocked comparator is configured to, be driven by a reference clock provided from the host when the device controller is not in a hibernation mode, and not be driven by the reference clock after the device controller enters the hibernation mode, and the clock comparator is configured to resume being driven by the reference clock before the device controller exits the hibernation mode.

13. The semiconductor circuit of claim 12, wherein the clocked comparator is configured to, power off when the provision of the reference clock from the host is stopped, and power on when the provision of the reference clock from the host is resumed.

14. The semiconductor circuit of claim 12, wherein the clocked comparator is configured to, output a hibernation exit signal based on a result of comparing the first input signal and the second input signal, and provide the hibernation exit signal to a power management unit (PMU), and the PMU provides power to the device controller.

15. The semiconductor circuit of claim 12, wherein the second input signal is a wake-up related signal and transits from a DIF_Z value to a DIF_N value.

16. The semiconductor circuit of claim 12, wherein the clocked comparator is configured to receive the first input signal and the second input signal from the host through a MIPI M-PHY layer of a UFS interface.

17. A semiconductor circuit comprising:

a clocked comparator configured to, receive a first input signal and a second input signal from a host and compare the first input signal and the second input signal; and an offset application circuit configured to apply an offset to the first input signal, wherein the clocked comparator is configured to be driven based on a reference clock provided from the host, and wherein the offset application circuit includes a plurality of differential input transistor circuits.

18. The semiconductor circuit of claim 17, wherein the clocked comparator is configured to, power off when the provision of the reference clock from the host is stopped, and power on when the provision of the reference clock from the host is resumed.

19. The semiconductor circuit of claim 17, wherein the clocked comparator is configured to, output a hibernation exit signal based on a result of comparing the first input signal and the second input signal, and provide the hibernation exit signal to a power management unit (PMU).

20. The semiconductor circuit of claim 17, further comprising:

a low pass filter configured to, receive the first input signal and the second input signal from the host, perform a low pass filter operation on the first input signal and the second input signal, and then provide the first input signal and the second input signal to the clocked comparator.

\* \* \* \* \*